(12) United States Patent
Hsu

(10) Patent No.: US 6,404,633 B1
(45) Date of Patent: Jun. 11, 2002

(54) SECURING EQUIPMENT FOR A HEAT DISSIPATER OF CPU

(75) Inventor: Hsien-Keng Hsu, No. 1, Ta Tung Farm, Feng Ming Village, Chu Tien Hsiang, Pingtung Hsien (TW)

(73) Assignees: Glacialtech Inc., Taipei Hsien; Hsien-Keng Hsu, Pingtung Hsien, both of (TW)

( * ) Notice: Subject to any disclaimer, the term of this patent is extended or adjusted under 35 U.S.C. 154(b) by 0 days.

(21) Appl. No.: 09/932,993

(22) Filed: Aug. 21, 2001

(51) Int. Cl.[7] ................................. H05K 7/20
(52) U.S. Cl. .................. 361/703; 24/458; 248/510; 257/727; 361/704; 361/697
(58) Field of Search .................. 361/687, 695, 361/697, 703, 704, 722, 709–712, 717–719; 165/80.3, 185; 24/453, 457, 459, 458, 625; 174/16.3; 248/316.7, 505, 510; 257/718, 719, 726, 727

(56) References Cited

U.S. PATENT DOCUMENTS 6,061,239 A * 5/2000 Blomquist .................. 361/704
6,082,440 A * 7/2000 Clemens et al. ........... 165/80.3
6,332,251 B1 * 12/2001 Ho et al. ....................... 24/459

* cited by examiner

Primary Examiner—Gerald Tolin
(74) Attorney, Agent, or Firm—Rosenberg, Klein & Lee

(57) ABSTRACT

A securing equipment for a heat dissipater of a CPU includes a holed main body, and a movable element. The heat dissipater is positioned in a holding member for the bottom to abut the top of the CPU. The main body has rear hooks separably connected to rear holes of the holding member. The movable element includes a control part, and a front part having up-sticking portions pivoted to the upper portion of the control part. The lower portion of the control part is pivoted to the front of the main body so as to be pivotable between a vertical position where the up-sticking portions stand upright in a locking position and a horizontal position where the up-sticking portions is in a sloping unlocking position. The front part of the movable element is further formed with hooks, which engage front holes of the holding member when the up-sticking portions stand upright in the locking position, so as to cause the main body to be pressed against the tops of the radiating fins of the heat dissipater. The main body can be removed together with the movable element after the control part has been pivoted to the horizontal position.

4 Claims, 4 Drawing Sheets

SECURING EQUIPMENT FOR A HEAT DISSIPATER OF CPU

BACKGROUND OF THE INVENTION

The present invention relates to a securing equipment for a heat dissipater of CPU, and more particularly, to one which can be secured to a holding member of the heat dissipater to fix the heat dissipater in position with ease and in such a way as to allow the heat dissipater to be mounted on the CPU with even pressure.

CPU would produce a large amount of heat when working, and the large amount of heat has to be dissipated, otherwise the CPU is likely to break down or get damaged. Therefore, a heat dissipating element is fitted onto the CPU to dissipate the heat produced by the CPU when the CPU is working.

Referring to FIG. 5, a conventional securing equipment for a heat dissipater of a CPU includes two securing elements 30, each having a flexible elongated pressing part and connecting ends 301 and 302 at two ends of the elongated pressing part. The connecting ends 301 and 302 each has a hole 3011 and 3021.

The heat dissipater 10 takes the form which has a base part 101, and several radiating fins 102 spaced in the base part 101. The heat dissipater 10 is provided with a holding member 40, which is secured to the main holding board (not shown) of a computer and formed with securing protrusions 401 and 402 sticking out on two lateral edges thereof. An electric fan (not shown) is fitted adjacent to the heat dissipater 10 in the computer for dissipating the heat traveling through the radiating fins 102. The heat dissipater 10 is mounted on the holding member 40 with the elongated pressing parts of the securing elements 30 being positioned on top of the radiating fins 102 and the connecting end holes 3011 and 3021 being connected to the securing protrusions 401 and 402 of the holding member 40. Thus, the bottom of the heat dissipater 10 abuts the top of the CPU fitted to main holding board of the computer with a pressure so as to allow the heat of the CPU to pass through the fins 102 to be dissipated. Furthermore, heat dissipating ointment is applied over the top of the CPU for heat to travel to the heat dissipater with increased speed.

However, the securing element 30 is found to have the following drawbacks:

Firstly, the user of the computer has to remove the securing element by means of suitable tools such as screwdrivers for permitting the heat dissipater 10 and the CPU to be removed for maintenance, replacement, or upgrading thereof. Consequently, the securing element is likely to get deformed by the screwdrivers after many times of removals which are possible because computers are upgraded very frequently nowadays.

Secondly, the heat dissipating ointment applied over the top of the CPU would become unevenly distributed between the top of the CPU and the bottom of the heat dissipater because the securing elements are connected to the securing protrusions 401 of the holding member 40 from one end first and the other end after. Consequently, the effect of the ointment is reduced. In addition, the heat dissipater is likely to be mounted on the CPU with uneven: pressure due to a slight change in the shape of the connecting ends of the securing elements, reducing the speed of the heat of the CPU traveling to the heat dissipater.

SUMMARY OF THE INVENTION

Therefore, it is a main object of the present invention to provide a securing equipment for a heat dissipater of a CPU, which can be secured in position and removed from the secured position very easily, and which can help the heat dissipater to be mounted on the CPU with even pressure.

The securing equipment of the present invention includes a holed main body and a movable connecting element. The main body has downward-sticking connecting parts at a rear end, and is separably connected to the holding member of the heat dissipater with the connecting parts engaging rear securing holes of the holding member, the heat dissipater is positioned in the holding member with the bottom abutting the top of the CPU.

The movable element includes a control part, and a front connecting part having a pair of upward-sticking portions pivoted to an upper part of the control part. The control part is pivoted to the front of the main body from a lower part so as to be pivotable between a vertical locking position where the upward-sticking portions stand upright in a locking position and a substantially horizontal position where the upward-sticking portions is moved to a sloping unlocking position. Downwards-sticking hooked portions are formed on the front connecting part, and are fixedly connected to front securing holes of the holding member when the upper-sticking portions are pivoted to the locking position, so as to cause the main body to be pressed against the top of the heat dissipater. The main body is further provided with resilient pressing elements on the bottom; the pressing elements are constantly positioned in a horizontal position so as to not cause the heat dissipater to be pressed against the CPU with uneven force when the control part is pivoted from the unlocking position to the locking position.

BRIEF DESCRIPTION OF THE DRAWINGS

This invention will be better understood by referring to the accompanying drawings, wherein.

DETAILED DESCRIPTION OF THE PREFERRED EMBODIMENT

Figure 1:
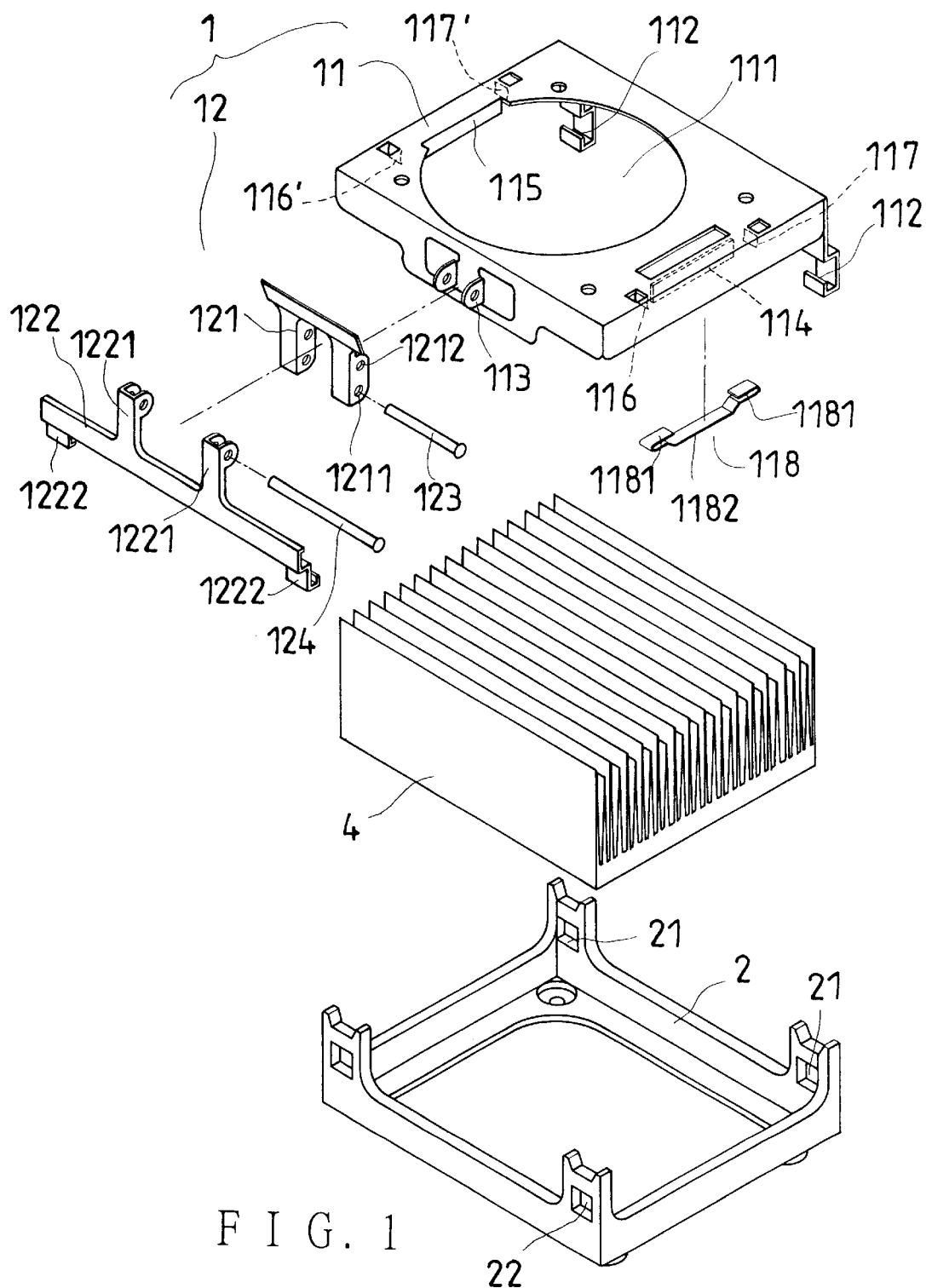
FIG. 1 is an exploded perspective view of the present invention.
Figure 2:
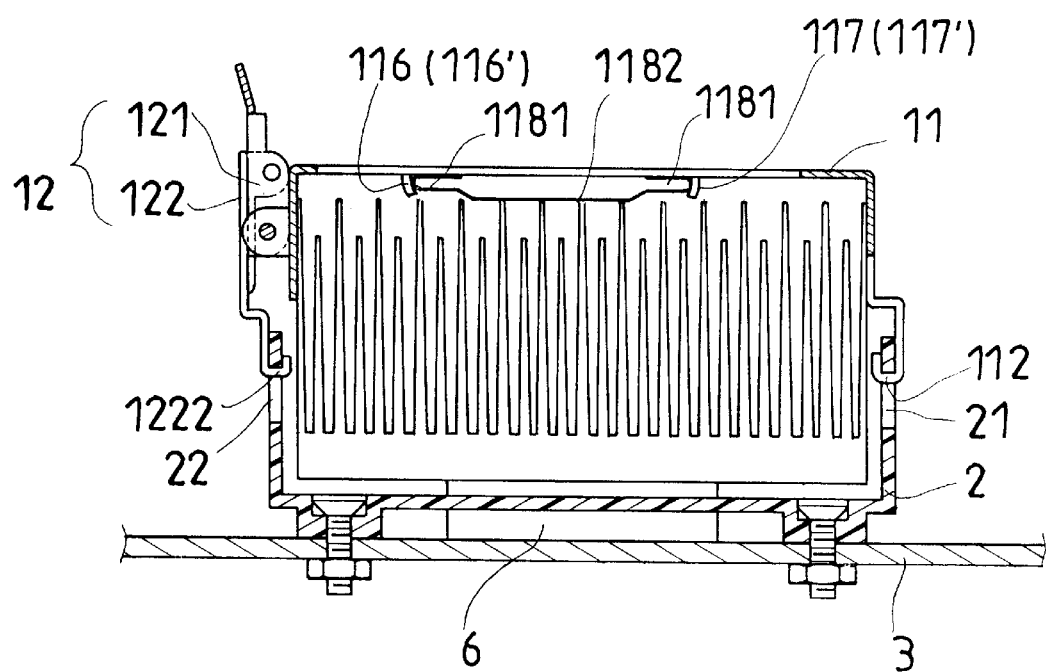
FIG. 2 is a cross-sectional view of the present invention in the locking position.

Referring to FIGS. 1 and 2, a securing equipment 1 for a heat dissipater of a CPU in the present invention includes a main body 11, a pair of pressing elements 118 and a movable connecting element 12. And, the securing element 1 has to be used with a holding member 2, which is fixed on a main holding board 3 (FIG. 2) of a computer, and has securing holes 21 and 22 at a front wall and a rear wall respectively. A heat dissipater 4 is mounted on the holding member 2 with the bottom coming into contact with the top of a CPU 6 as shown in FIG. 2; the heat dissipater 4 has radiating fins spaced out on the base part.

Figure 3:
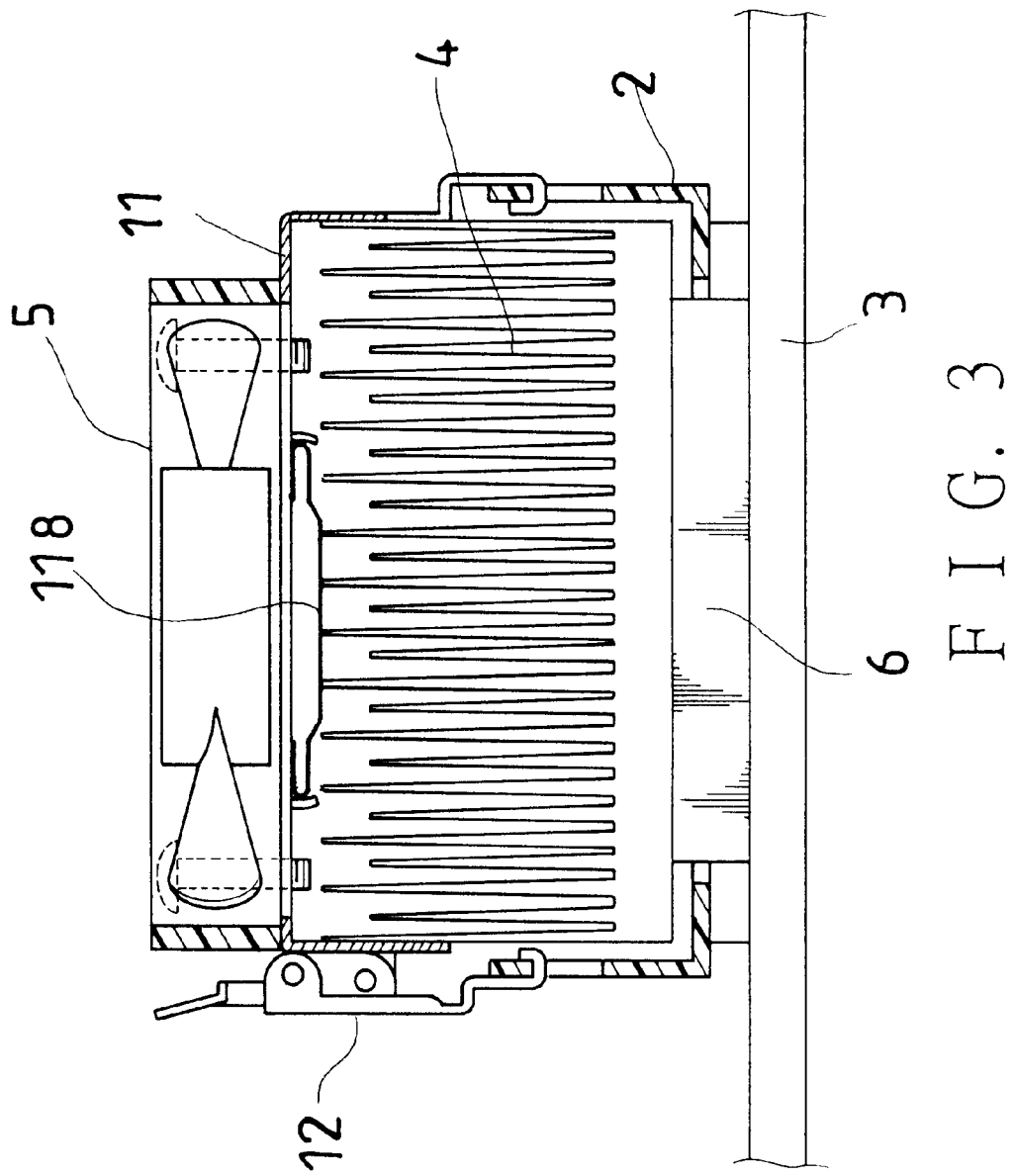
FIG. 3 is a cross-sectional view of the present invention with an electric fan being joined thereto.
Figure 5:
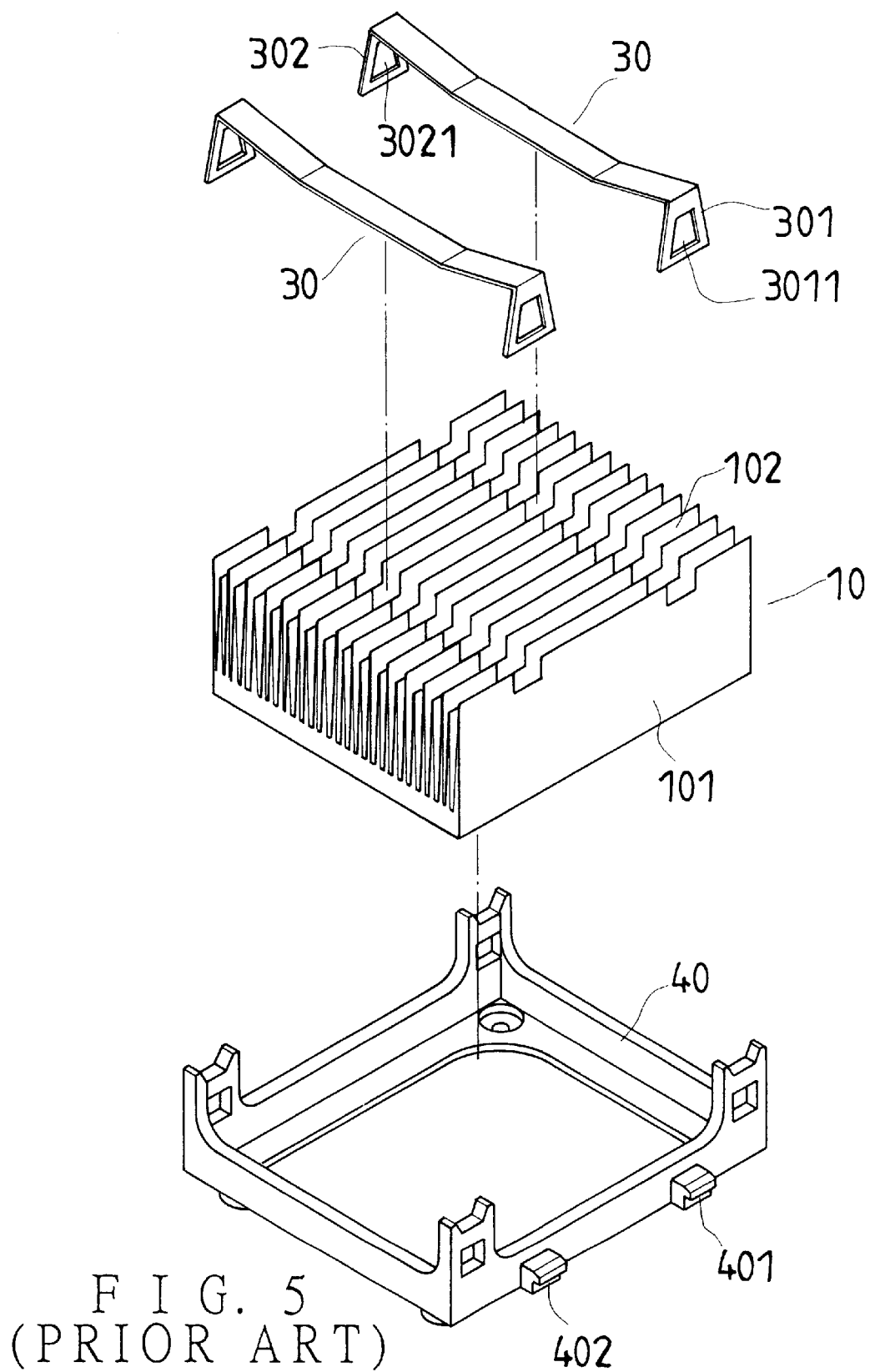
FIG. 5 is an exploded perspective view of the prior art securing equipment as described in the Background.

The main body 11 includes an opening 111 on the upper side, a pair of pivotal protrusions 113 at the front, connecting parts 112 sticking down from the rear edge and two confining areas each defined by a front confining plate 116(116'), a rear confining plate 117(117'), a confining wall 114(115) and a lateral wall (not numbered) of the main body 11. The opening 111 is provided for allowing air from an electric fan 5 (FIG. 3) to travel into the heat dissipater 4 to dissipate the heat on the radiating fins. The pivotal protrusions 113 are formed with pivotal holes. The connecting parts 112 can be shaped like hooks. The confining areas are each provided to receive and secure one of the pressing elements 118; the pressing elements 118, which can be made of steel, each has two folded parts 1181 at two ends and a depressed part 1182 between the folded parts 1181; the folded parts 1181 are folded inwardly of the middle of the element 118 to a slightly sloping position so as to have resilience. The pressing elements 118 are secured in the confining areas with the resilient folded parts 1181 being disposed above the depressed parts 1182.

The movable connecting element 12 includes a control part 121, and a front connecting part 122. The control part 121 has an upper moved portion (not numbered), and two parallel pivoted portions each having an upper pivotal hole 1212 and a lower pivotal hole 1211. The front connecting part 122 has two parallel extension portions 1221 sticking up from the horizontal main body thereof and folded connecting plates 1222 sticking down from the main body; extension portions 1221 each has a hole (not numbered) at the upper end; the folded plates 1222 are shaped like hooks.

In assembly, a first pivotal rod 123 is passed through the lower pivotal holes 1211 of the control part 121 and the pivotal holes of the protrusions 113 of the main body 11, and a second pivotal rod 124 is passed through the upper pivotal holes 1212 and the holes of the extension portion 1221 of the front connecting part 122. Thus, the front connecting part 122 can be moved between a locking position, as shown in FIG. 2, where the control part 121 is pivoted about the first rod 123 to a substantially upright position so as to make the extension portions 1221 to stand upright and an unlocking position, as shown in FIG. 4, where the control part is pivoted outwardly to a substantially horizontal position so as to make the extension portion 1221 stand in a sloping position.

Figure 4:
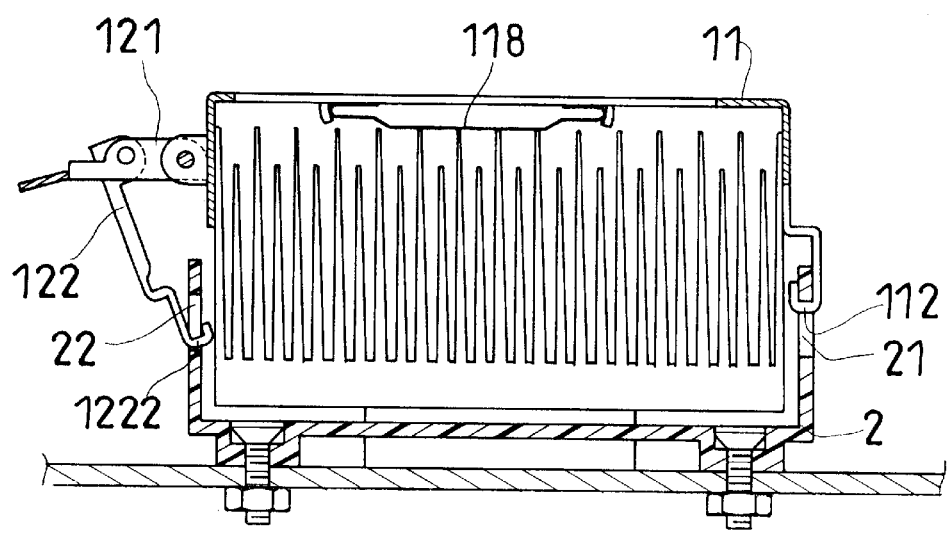
FIG. 4 is a cross-sectional view of the present invention in the removable position

To mount the securing equipment I onto the heat dissipator 4, first the hooked rear connecting parts 112 are connected to the securing holes 21 on the rear wall of the holding member 2, and the folded plates 1222 are passed into the front securing holes 22 of the holding member 2 with the extension portions 1221 being kept in the sloping positions as shown in FIG. 4. Then, the control part 121 is pivoted up to the locking position to make the extension portions 1221 move to the upright position. Thus, the main body 11 is firmly connected to the holding member 2 with the depressed parts 1182 of the pressing elements 118 being pressed against the top of the radiating fins of the heat dissipater 4; the folded parts 1181 of the pressing elements 118 allow the pressing elements 118 to be pressed against the top of the fins with a proper force due to the resilience thereof.

To move the securing equipment 1, the control part 121 is pivoted to the unlocking position to make the folded connecting plates 1222 become separable from the front securing holes 22. Thus, the securing element 1 can be removed from the holding member 2 easily.

From the above description, we can easily understand that the securing equipment of the present invention has the following advantages:

1. The securing equipment can be removed from the holding member 2 after the control part 121 has been pivoted to the unlocking position, therefore the removal is relatively easy as compared with the prior art, taking much less labor and needing no tools such as screwdrivers. Thus, the frequent removal of the securing equipment for maintenance or replacement of both the heat dissipater and the CPU won't cause the user any inconvenience.

2. The pivotal movement of control part 121 to the locking position won't cause the heat dissipating ointment applied over the top of the CPU to be distributed unevenly because the pressing elements 118 are constantly positioned in the horizontal position to not cause the bottom of the securing equipment to be pressed against the top of the CPU with uneven pressure. Thus, the heat produced by the CPU can travel to the heat dissipater effectively because the securing equipment is pressed against the CPU with even force without sloping.

What is claimed is:

1. A securing equipment for a heat dissipater of a CPU, comprising a main body having downward-sticking connecting parts at a rear end; said connecting parts being separably connected to rear securing holes of a holding member fixed on a computer main holding board having said CPU mounted thereon; said heat dissipater having a base part and plurality of radiating fins sticking up from said base part; said heat dissipater being removably positioned in said holding member with a bottom of said base part abutting a top surface of said CPU; and characterized by a movable connecting element including a control part having a pair of upper pivotal holes and a pair of lower pivotal holes, and a front connecting part having a pair of upward-sticking extension portions pivoted to said pair of upper pivotal holes of said control part; said front connecting part having downward-sticking folded connecting portions; said control part being pivoted to a front of said main body from said pair of lower pivotal holes so as to be pivotable between a substantially vertical locking position where same makes said extension portions of said front connecting part pivot to a locking position and a substantially horizontal unlocking position where same makes said extension portions pivot to an unlocking sloping position; said folded connecting portions being fixedly connected to front securing holes of said holding member when said extension portions of said front connecting part are pivoted to said locking position, so as to cause said main body to be pressed against tops of said radiating fins of said heat dissipater; said main body being removable together with said movable connecting element after said control part has been pivoted about said front of said main body to said unlocking position.

2. The securing equipment for a heat dissipater of a CPU as claimed in claim 1, wherein said main body has an opening on an upper side for allowing air to travel through, and has a plurality of confining areas formed on a bottom; said confining areas each having a pressing element secured therein; said pressing elements each having a middle depressed part and two end resilient parts folded in a sloping position toward said depressed part; said pressing elements being positioned in said confining areas such as to allow said resilient folded end parts to make said depressed parts pressed against said fins with a predetermined force.

3. The securing equipment for a heat dissipater of a CPU as claimed in claim 2, said depressed parts of said pressing elements of said main body are constantly positioned in a horizontal position so as to not cause said heat dissipater to be pressed against said CPU with uneven force when said control part is pivoted from said unlocking position to said locking position.

4. The securing equipment for a heat dissipater of a CPU as claimed in claim 3, wherein said pressing elements can be made of resilient steel.

* * * * *